(12) United States Patent
Kito et al.

(10) Patent No.: US 10,861,199 B2
(45) Date of Patent: Dec. 8, 2020

(54) SYSTEM FOR CREATING COMPONENT SHAPE DATA FOR IMAGE PROCESSING, AND METHOD FOR CREATING COMPONENT SHAPE DATA FOR IMAGE PROCESSING

(71) Applicant: FUJI CORPORATION, Chiryu (JP)

(72) Inventors: Shuichiro Kito, Toyota (JP); Yuki Inaura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/340,730

(22) PCT Filed: Oct. 25, 2016

(86) PCT No.: PCT/JP2016/081535
§ 371 (c)(1),
(2) Date: Apr. 10, 2019

(87) PCT Pub. No.: WO2018/078714
PCT Pub. Date: May 3, 2018

(65) Prior Publication Data
US 2019/0318514 A1 Oct. 17, 2019

(51) Int. Cl.
*G06T 11/20* (2006.01)
*G06T 7/13* (2017.01)
(Continued)

(52) U.S. Cl.
CPC .......... *G06T 11/203* (2013.01); *G01B 11/028* (2013.01); *G01B 11/24* (2013.01);
(Continued)

(58) Field of Classification Search
None
See application file for complete search history.

(56) References Cited

U.S. PATENT DOCUMENTS 5,974,169 A 10/1999 Bachelder
2001/0054018 A1* 12/2001 Kuribayashi ...... G06Q 30/0643
707/737
(Continued)

FOREIGN PATENT DOCUMENTS

JP H10135700 A * 10/1996
JP 10-135686 A 5/1998
(Continued)

OTHER PUBLICATIONS

Hirotake Esaki et al., "Automatic Generation of IC Component Configuration Data", Electrical Engineering in Japan, vol. 165, No. 4, XP55519512, 2008, pp. 76-83.
(Continued)

*Primary Examiner* — Patrick F Valdez
(74) *Attorney, Agent, or Firm* — Obion, McClelland, Maier & Neustadt, L.L.P.

(57) ABSTRACT

A system for creating component shape data for image processing to be used when performing image recognition of a component to be mounted by a component mounter including drawing a wire frame on top of the component image such that the wire frame surrounds a measurement target portion of the component image displayed on a display section; automatically aligning the position of the side of the wire frame to the edge position of the measurement target portion; and creating the component shape data for image processing by measuring the shape data of the measurement target portion surrounded by the wire frame for which the four sides of the wire frame were automatically aligned with the edge positions in four directions of the measurement target portion by the automatic aligning.

6 Claims, 6 Drawing Sheets

(51) Int. Cl.
*G06T 7/70* (2017.01)
*G01B 11/02* (2006.01)
*G01B 11/24* (2006.01)

(52) U.S. Cl.
CPC ............ *G06T 7/13* (2017.01); *G06T 7/70* (2017.01); *G06T 2200/24* (2013.01)

(56) References Cited

U.S. PATENT DOCUMENTS

| | | | | |
|---|---|---|---|---|
| 2009/0141288 | A1* | 6/2009 | Nishio | G01B 11/026 356/614 |
| 2011/0243456 | A1* | 10/2011 | Kawai | G06K 9/6253 382/203 |
| 2014/0282060 | A1* | 9/2014 | Bhardwaj | G06F 3/04842 715/744 |
| 2016/0125590 | A1* | 5/2016 | Yoshida | H01L 22/12 348/87 |

FOREIGN PATENT DOCUMENTS

| | | | |
|---|---|---|---|
| JP | 2005132342 | * | 4/2005 |
| JP | 2011-211088 A | | 10/2011 |
| WO | WO 2014/208193 A1 | | 12/2014 |

OTHER PUBLICATIONS

Huihui Wu et al., "Automated Visual Inspection of Surface Mounted Chip Components", Proceedings of the 2010 IEEE International Conference on Mechatronics and Automation, XP31764845, Aug. 4-7, 2010, pp. 1789-1794.

International Search Report dated Dec. 6, 2016 in PCT/JP2016/081535 filed on Oct. 25, 2016.

* cited by examiner (Proceed to step 108 of fig. 6)

SYSTEM FOR CREATING COMPONENT SHAPE DATA FOR IMAGE PROCESSING, AND METHOD FOR CREATING COMPONENT SHAPE DATA FOR IMAGE PROCESSING

TECHNICAL FIELD

Disclosed herein is a system and a method for creating component shape data for image processing used when performing image recognition of components to be mounted using a component mounter.

BACKGROUND ART

Generally, when performing image recognition at a component mounter by using a camera to image a component being held by a suction nozzle, component shape data (data representing external visual characteristics of the component such as dimensions of the component body and positions, width, length, pitch, and quantity of leads) used for image processing and created in advance is used to perform image recognition of the component, and a determination is made about the pickup position deviation amount of the component and whether the pickup orientation is acceptable. Conventionally, when creating component shape data for image processing at a user side component mounter, in addition to a method using CAD data of the component, there is a method of using a camera to image a component that is a target for creation of component shape data for use in image processing, and using the captured image to create the component shape data for use in image processing.

With this type of system for creating component shape data for use in image processing, an operator must specify which portions of the component image captured by the camera to measure, and to do so the operator draws a wire frame on top of the component image such that the wire frame surrounds the portion to be measured (for example, a component body portion, a row of leads, or the like) of the component image displayed on the screen, then operates a mouse to use a mouse pointer displayed on the display device to select a size-changing handle at the center of a side of the wire frame, and specify the edge positions of the measurement target positions by performing a drag operation to move the position of the wire frame towards the edge position of the measurement target portion, aligning them, and performing these operations for the four sides of the wire frame, thereby creating component shape data for use in image processing by the shape data (for example, lengthwise and widthwise dimensions or the like) of the measurement target portion surrounded by the four sides of the wire frame being measured.

CITATION LIST

Patent Literature

Patent Literature 1: JP-A-2011-211088

SUMMARY OF INVENTION

Technical Problem

However, for an operator to accurately align the positions of the sides of the wire frame with the edge positions of the measurement target portions using a drag operation of a mouse, it is necessary to move the mouse pointer gradually near the edge positions of the measurement target portion, meaning that extremely fine drag movements are required to gradually move the positions of the sides of the wire frame. Such fine drag operation means that an operator's hand will soon get tired, and usability is poor, which means that component shape data for image processing cannot be created efficiently.

Further, depending on the operator, the drag operation may be rough, and there are cases in which the drag operation is completed in a position with the positions of the sides of the wire frame minutely deviated from the edge positions of the measurement target portions, the region surrounded by the wire frame is taken as the measurement target portion, and the shape data of that measurement target portion is measured, in which case, the measurement accuracy of the shape data of the measurement target portion worsens, and the creation accuracy of the component shape data for use in image processing worsens. A decrease in the creation accuracy of component shape data for use in image processing leads to a decrease in component image recognition accuracy during operation of the component mounter, which worsens component mounting accuracy.

Solution to Problem

To solve the above problems, disclosed is a system for creating component shape data for image processing to be used when performing image recognition of a component to be mounted by a component mounter, the system including: a display section configured to display a captured component image of a component that is a creation target for the component shape data for image processing; a wire frame drawing section configured to draw a wire frame on top of the component image such that the wire frame surrounds a measurement target portion of the component image displayed on the display section, and to move a position of a side of the wire frame in accordance with a drag operation of an operator; an edge position detection section configured to use image processing to detect an edge position of the measurement target portion of the component image; an automatic drag section configured to automatically align the position of the side of the wire frame to the edge position of the measurement target portion when the position of the side of the wire frame moved by the drag operation of the operator enters a specified range near to the edge position of the measurement target portion detected by the edge position detection section; and a component shape data creation section configured to create the component shape data for image processing by measuring the shape data of the measurement target portion surrounded by the wire frame for which the four sides of the wire frame were automatically aligned with the edge positions in four directions of the measurement target portion by the automatic drag section.

With this configuration, an edge position of the measurement target portion of the component image is detected by image processing, and when the position of the side of the wire frame moved by the drag operation of the operator enters a specified range near to the edge position of the measurement target portion detected by the edge position detection section, the automatic drag section automatically aligns the position of the side of the wire frame to the edge position of the measurement target portion, thus, an operator is able to accurately align the position of the sides of the wire frame with the edge positions of the measurement target portion even with a relatively rough drag operation. Thus, the usability of drag operation by the operator is improved, component shape data for image processing is created efficiently, the measurement accuracy of the shape data of the measurement target portion using the wire frame is improved, and the creation accuracy of the component shape data for image processing is improved.

With the above system, the edge position detection section may be configured to detect a brightness change of the component image in a drag operation direction and to detect a position where the brightness change is large as an edge position of the measurement target portion, in particular, the edge position detection section may be configured to project a brightness level of a region along a straight line that passes through each side of the wire frame in the component image along a coordinate axis extending in the drag operation direction, and to detect a position for which a change ratio of a projection brightness exceeds a specified range as the edge position of the measurement target portion. Accordingly, for example, in a case of detecting an edge position of a body portion of a component, even if there are letters or symbols on the body portion, those letters or symbols are prevented from being misrecognized as the edge of the body portion.

However, the component image may be displayed on the display section tilted at an angle, and with the component image at an angle, it is not possible to accurately align the four sides of the wire frame with the edges in four directions of the measurement target portion of the component image, which decreases the measurement accuracy of the shape data of the measurement target portion.

As a countermeasure to this, a component angle correction section configured to correct an angle of the component image displayed on the display section may be provided, and the wire frame drawing section may be configured to draw the wire frame on the component image for which the angle has been corrected by the component angle correction section. Thus, even if the component image is displayed at an angle on the display section, the angle can be corrected, the four sides of the wire frame can be accurately aligned with the edge positions of the measurement target portion in four directions, and the shape data of the measurement target portion can be measured accurately.

Such a system for creating component shape data for image processing may be provided externally to a component mounter or may be built into a component mounter.

When the system for creating component shape data for image processing is provided externally to the component mounter, an image processing system of the component mounter may perform image recognition of the component to be mounted by the component mounter using the component shape data for image processing created by the component shape data creation section.

On the other hand, when the system for creating component shape data for image processing is built into the component mounter, when investigating a cause of an error that occurred at the component mounter, the component held by a suction nozzle of the component mounter may be imaged using a component recognition camera of the component mounter, and that component image may be displayed on a display section of the component mounter such that the component shape data for image processing can be recreated. Thus, in a case in which the cause of an error that occurred at a component mounter is a mismatch of the component shape data for image processing, the component shape data for image processing can be corrected appropriately for the image processing system of the component mounter, the frequency of errors at the component mounter can be reduced, and the image recognition accuracy of components can be improved.

DESCRIPTION OF EMBODIMENTS

Figure 1:
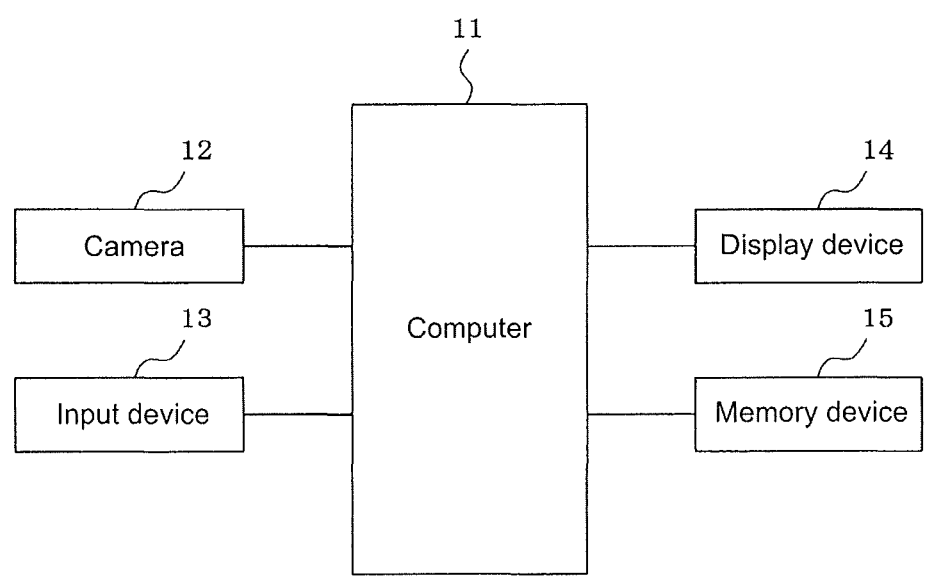
FIG. 1 is a block diagram showing the configuration of a system for creating component shape data for image processing of an embodiment.

An embodiment is described below. As shown in FIG. 1, a system for creating component shape data for image processing is provided with: computer 11 such as a personal computer; camera 12 that images a component that is a target for creating component shape data for image processing; input device 13 such as a keyboard, mouse, or touch-screen panel; display device 14 (display section) such as a liquid crystal display or a CRT; and memory device 15 that memorizes various pieces of data such as programs illustrated in FIGS. 5 to 7 performed when creating component shape data for image processing that are described later, the created component shape data for image processing, and the like. Memory device 15 is configured from a non-volatile memory that stores data rewritably and that retains the data when the power to the device is turned off (for example, a hard disk device or the like).

Computer 11 of the system for creating component shape data for image processing of the present embodiment, although not shown, is provided externally to the component mounter (externally to the component mounting line), and is connected such that communication is possible to each component mounter or a production management computer of the component mounting line via a network.

Computer 11, by performing the programs for creating component shape data for image processing illustrated in FIGS. 5 and 6, which are described later, functions as a "component angle correcting section" that corrects the angle of a component image displayed on display device 14, and functions as a "wire frame drawing section" that draws wire frame W (refer to FIG. 2) for surrounding measurement target portion P in the component image displayed on display device 14 on top of the component image and moves the position of the sides of the wire frame W in accordance with a drag operation of an operator.

Further, computer 11, by performing the measurement target portion edge position detecting program of FIG. 7, which is described later, functions as an "edge position detection section" that detects an edge position of measurement target portion P of the component image by image processing. Also, computer 11, by performing the programs for creating component shape data for image processing of FIGS. 5 and 6, which are described later, functions are an "automatic drag section" that automatically aligns the position of the side of the wire frame W to the edge position of the measurement target portion when the position of the side of the wire frame W moved by the drag operation of the operator enters a specified range near to the edge position of the measurement target portion P detected by the image processing, and functions as a "component shape data creation section" that creates the component shape data for image processing by measuring the shape data of the measurement target portion P surrounded by the wire frame W for which the four sides of the wire frame W were automatically aligned with the edge positions in four directions of the measurement target portion P by the automatic drag processing.

Figure 5:
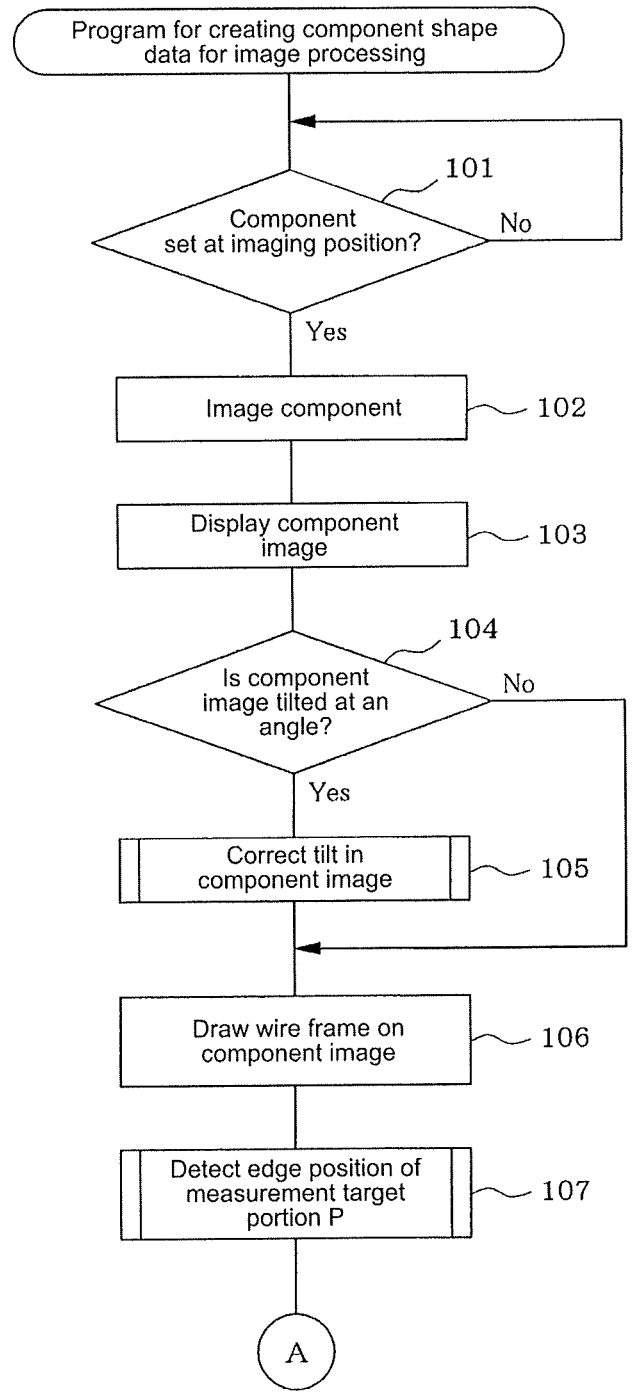
FIG. 5 is a flowchart showing a flow of a first half of processing of a creation program for component shape data for image processing.
Figure 6:
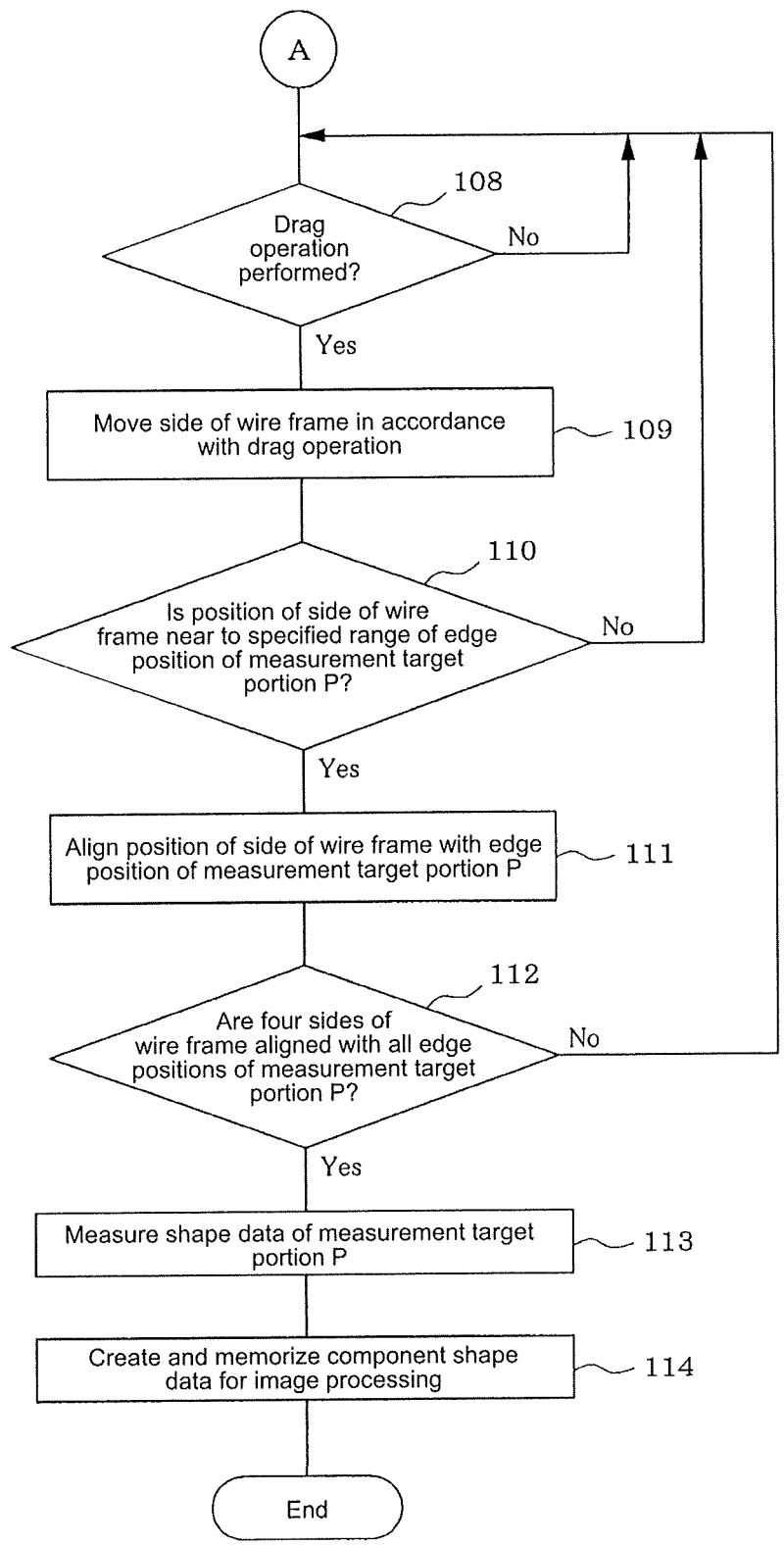
FIG. 6 is a flowchart showing a flow of a second half of processing of a creation program for component shape data for image processing.
Figure 7:
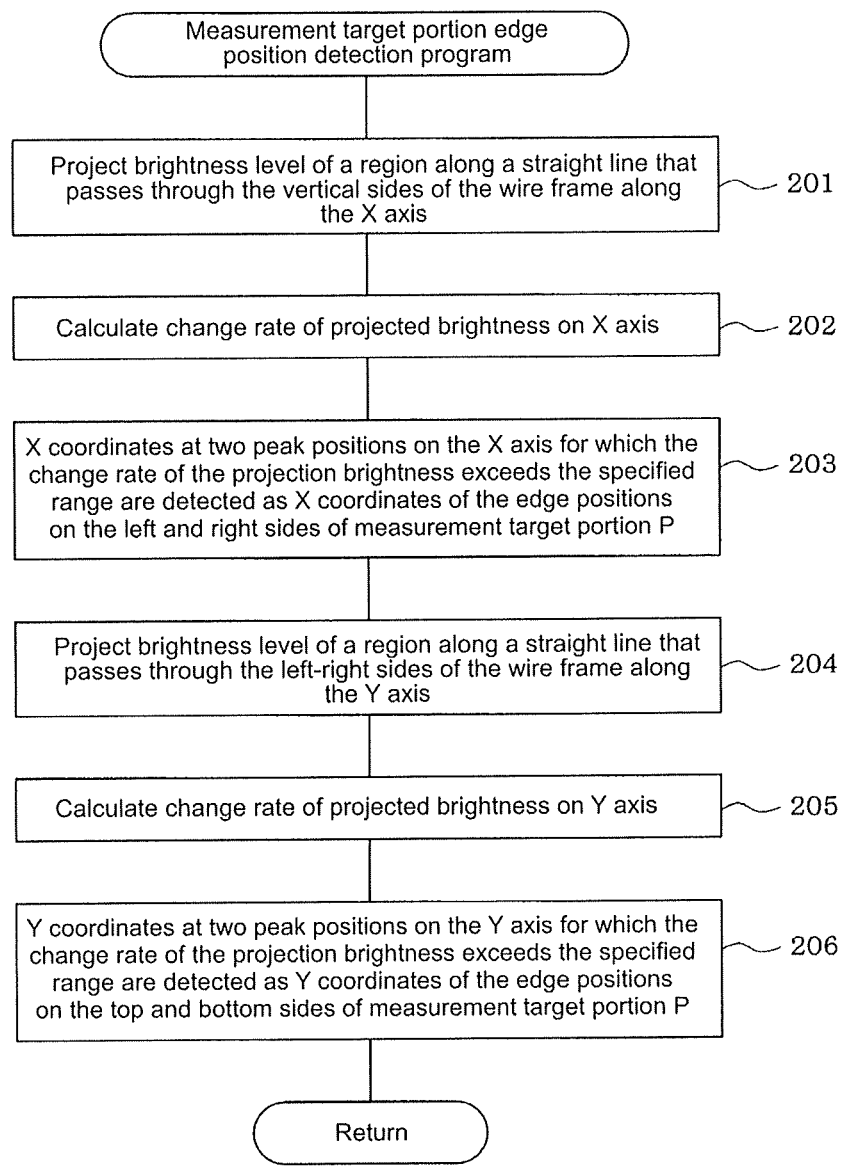
FIG. 7 shows a flow of processing of a measurement target portion edge position detection program.

A description of each function (1) to (5) realized by computer 11 performing the programs of FIGS. 5 to 7 is given below.

(1) Function as a Component Angle Correcting Section

When an image of a component that is a target for creation of component shape data for image processing is displayed on display device 14, the component image may be displayed on the display section tilted at an angle, and with the component image at an angle, it is not possible to accurately align the four sides of the wire frame W, which is displayed as a rectangle with sides parallel to the X axis and the Y axis displayed on the screen, with the edges in four directions of the measurement target portion P (for example, the body portion shown in FIG. 2) of the component image, which decreases the measurement accuracy of the shape data of the measurement target portion P.

Here, if the component image is displayed at an angle on display device 14, an operator operates input device 13 such as a keyboard and mouse and uses an angle correction function of an editor (image editing software) to correct the angle to 0 degrees by correcting the angle of the component image such that the upper, lower, left, and right sides of body portions P of the component image are respectively parallel to the X axis and Y axis.

Note that, the component image displayed on display device 14 is not limited to only a component image captured by camera 12, a file of a captured component image from a separate location may be read by computer 11 and displayed on display device 14.

(2) Function as a Wire Frame Drawing Section

Figure 2:
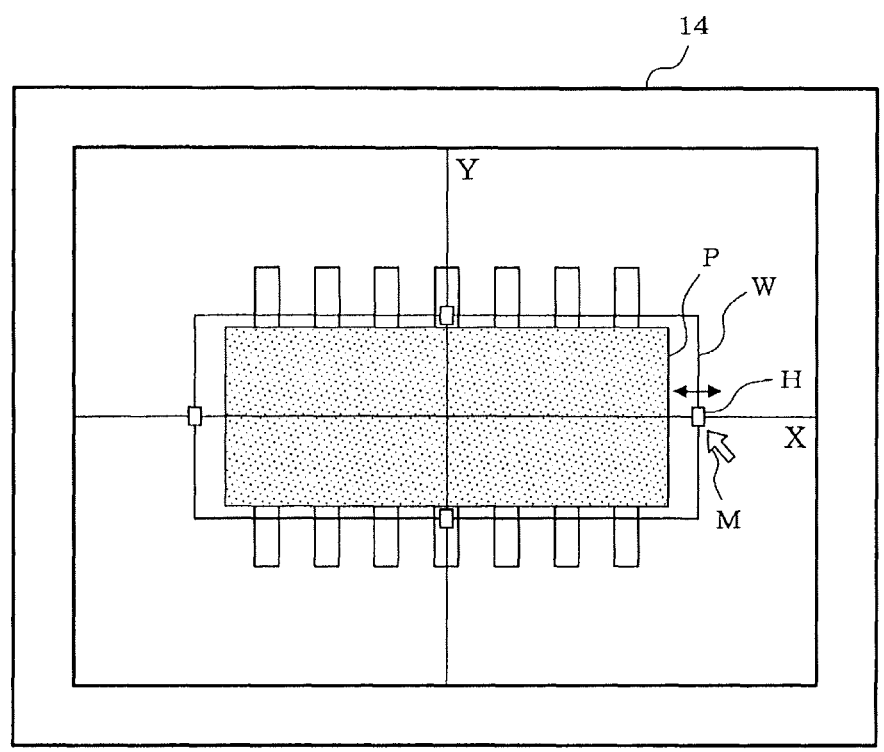
FIG. 2 shows an example of a component image and a wire frame.

As shown in FIG. 2, wire frame W for surrounding measurement target portion P in the component image displayed on display device 14 is drawn on top of the component image. An operator uses input device 13 such as a mouse to click and hold size changing handle H at the center of a side of wire frame W, and drags the mouse in a direction (left in the example shown in FIG. 2) towards an edge position of measurement target portion P. Thus, the positions of the sides of wire frame W are moved towards the edge positions of measurement target portion P in accordance with the drag operation by the operator. The operator, by performing the drag operation in turn on the four sides of wire frame W, adjusts the size and position of wire frame W.

(3) Function as an Edge Position Detection Section

To detect the edge position of measurement target portion P of the component image, the brightness change of the component image in the direction of the drag operation is detected, and a position at which this brightness change is large is detected as the edge position of measurement target portion P. For example, in a case in which the color of measurement target portion P is "black" and the surrounding background is "white" (or vice versa), the edge positions of measurement target portion P are detected by detecting the border line between the black and the white in the direction of the drag operation as the brightness change.

Figure 3:
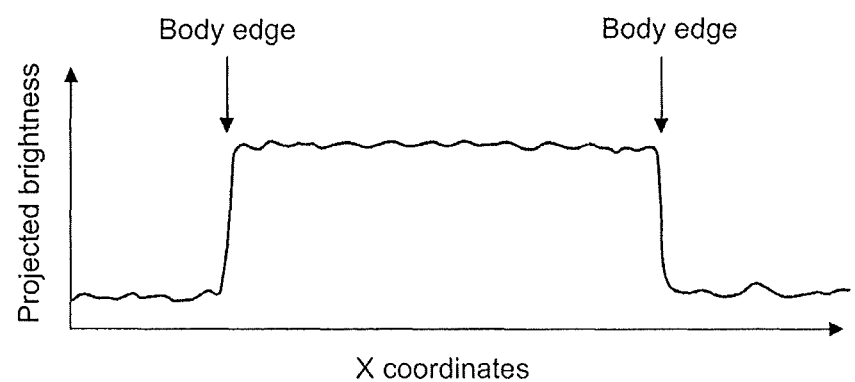
FIG. 3 is a graph showing an example of a brightness level of a rectangular region of a straight line passing through two sides of the wire frame in a vertical direction in the component image along an X axis and the change in the obtained projected brightness.

In the present embodiment, to improve the detection accuracy of the edge positions of measurement target portion P, a brightness level of a rectangular region along a straight line that passes through each side of the wire frame in the component image is projected along a coordinate axis extending in the drag operation direction. In the example shown in FIG. 2, because the drag operation direction is the X direction (left-right direction), a brightness level of a rectangular region along a straight line that passes through each side of the wire frame in the vertical direction is projected on the X axis, and a change in the projected brightness in the X direction level is obtained as shown in FIG. 3. Here, "a brightness level of a rectangular region is projected on the X axis" means "a brightness level of each pixel of a rectangular region is calculated for each X coordinate".

If the drag operation direction is the Y direction (vertical direction), a brightness level of a rectangular region along a straight line that passes through each side of the wire frame in the left-right direction is projected on the Y axis (a brightness level of each pixel of a rectangular region is calculated for each Y coordinate), and a change in the projected brightness in the Y direction is obtained Thus, by projecting a brightness level of a rectangular region along a straight line that passes through each side of wire frame W along an axis that extends in the drag operation direction, for example, in a case of detecting an edge position of a body portion P of a component, even if there are letters or symbols on the body portion P, those letters or symbols are prevented from being misrecognized as the edge of the body portion.

Figure 4:
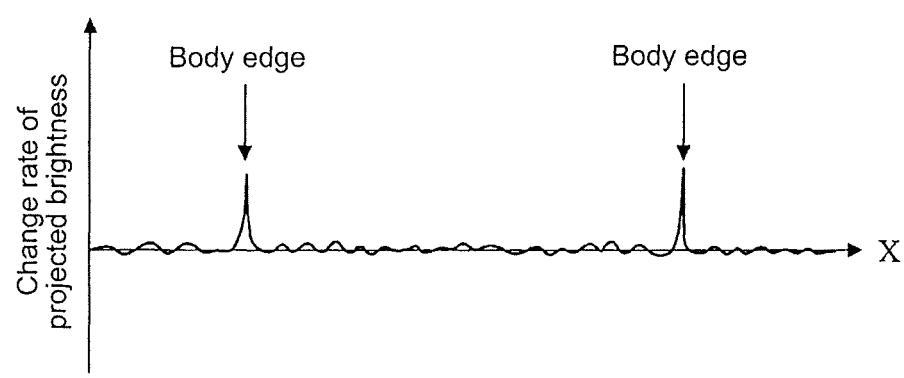
FIG. 4 shows an example of a change rate of the projection brightness on the X axis.

Further, in the present embodiment, to make it easy to detect a position for which there is a large change in the projection brightness on the X and Y axes, as shown in FIG. 4, a change rate of the projection brightness on the X axis (=projection brightness/$\Delta X$) is calculated, and a position (peak position) at which the change rate of the projection brightness on the X axis exceeds a specified range is detected as the edge position of the measurement target portion P in the X direction. Similarly, a change rate of the projection brightness on the Y axis (=projection brightness/$\Delta Y$) is calculated, and a position (peak position) at which the change rate of the projection brightness on the Y axis exceeds a specified range is detected as the edge position of the measurement target portion P in the Y direction.

Note that, detection of the edge positions of measurement target portion P is not limited to the above method, various methods of detecting the edge positions using image processing may be used.

(4) Function as an Automatic Drag Section

When a position of a side of wire frame W on which an operator performs a drag operation enters a specified range of an edge position of measurement target portion P detected by the peak position of the change rate of the projection brightness, the position of the side of the wire frame W is automatically aligned with the edge position of measurement target portion P. Here, a "detected specified range of an edge position of measurement target portion P" means, specifically, "a range of specified pixels+/− from a peak position of a change rate of the projection brightness".

Thus, an operator, by simply moving the position of a side of wire frame W by a drag operation inside a specified region of an edge position of measurement target portion P, is able to automatically align the position of the side of the wire frame W with the edge position of measurement target portion P, making drag operation easy.

(5) Function as a Component Shape Data Creation Section

The shape data (for example, X-direction dimension, Y-direction dimension, and the like) of the measurement target portion P surrounded by the wire frame W for which the four edges of the wire frame W were automatically aligned to the four edge positions of the measurement target portion P using the above automatic drag processing is measured, and the component shape data for image processing is created based on the measured value of the shape data.

Note that, a measurement target portion is not limited to a body portion and may be, for example, electrodes such as leads or bumps.

For example, if leads are the measurement target portion, a row of leads on a measurement target of the component is surrounded by wire frame W, the length of each lead is measured, a lead side edge separated from the side (edge of row) of the wire frame W by a lead pitch is specified using pointer M, the lead pitch is measured, and, further, by dividing the dimension between both sides of wire frame W (length of lead row) by the lead pitch, the quantity of leads is obtained, and the position of each lead is calculated from the position of wire frame W (position of lead row) and the quantity of leads. The measurement of the width of leads may be performed by using the mouse to specify a lead-side edge separated from a side of wire frame W (an edge of the row of leads) by a width of the leads, or by surrounding a single lead with wire frame W and measuring the width of the lead.

If bumps on the lower surface of the component are the measurement target portion, the bump pitch, bump diameter, and position of each bump may be measured by surrounding the entire pattern formed by the bumps with the wire frame W, and using a similar method for measuring the shape data of leads as described above.

Each of the functions (1) to (5) described above is realized by computer 11 performing the programs illustrated in FIGS. 5 to 7. A portion of the processing of each of the programs illustrated in FIGS. 5 to 7 may be processed by hardware. Processing of the programs illustrated in FIGS. 5 to 7 is described below.

Program for Creating Component Shape Data for Image Processing

When the program for creating component shape data for image processing of FIGS. 5 and 6 is started, first, in step 101, processing stands by until a component that is the target for creation of the component shape data for image processing is set at an imaging position within the field of view of camera 12. Next, when the component has been set at the imaging position, proceeding to step 102, camera 12 images the component, then, proceeding to step 103, the component image is displayed on display device 14.

Next, proceeding to step 104, it is determined whether the component image displayed on display device 14 is at an angle, and if the component image is not at an angle, processing proceeds to step 106, and if the component image is at an angle, processing proceeds to step 105, in which case processing proceeds to step 106 after an operator corrects the angle of the component image. Processing of the above step 105 performs the role of the component angle correcting section.

In step 106, wire frame W for surrounding measurement target portion P of the component image displayed on display device 14 is drawn on top of the component image. Then, proceeding to step 107, by performing the measuring target portion edge position detection program of FIG. 7, which is described later, the edge positions of measurement target portion P of the component image are detected.

Next, proceeding to step 108 of FIG. 6, processing stands by until an operator performs a drag operation. Then, when the operator performs the drag operation, proceeding to step 109, the positions of the sides of wire frame W are moved in the drag operation direction in accordance with the drag operation of the operator. Processing of the above steps 106 and 108 to 109 performs the role of the wire frame drawing section.

Then, in step 110, it is determined whether the position of the side of wire frame W on which the drag operation was performed by the operator is in the specified range of the edge position of measurement target portion P detected from the peak position of the change rate of the projection brightness, and in a case in which the position of the side of the wire frame W is not in the specified range of the edge position of measurement target portion P, processing of the above steps 108 to 110 is repeated. Then, when the position of the side of wire frame W enters the specified range of the edge position of the measurement target portion P, proceeding to step 111, the position of the side of the wire frame W is automatically aligned with the edge position of the measurement target portion P. Processing of the above steps 110 and 111 performs the role of the automatic drag section.

Then, proceeding to step 112, it is determined whether all the four sides of the wire frame W have been aligned with the edge positions of measurement target portion P in four directions, and if there is still a side of the wire frame W that has not been aligned with an edge position of measurement target portion P, processing of the above steps 108 to 112 is repeated. Thus, when all four sides of the wire frame W have been aligned with the edge positions of measurement target portion P in four directions, processing proceeds to step 113 where the component data (for example, X-direction dimension, Y-direction dimension, and the like) of the measurement target portion P surrounded by the wire frame W is measured, then, in step 114, the component shape data for image processing is created based on the measured value of the shape data and memorized on memory device 15, then the program ends. Processing of the above steps 113 and 114 performs the role of the component shape data creation section.

Measurement Target Portion Edge Position Detection Program

The measurement target portion edge position detection program of FIG. 7 is a routine performed at step 107 of the program for creating component shape data for image processing of FIGS. 5 and 6 described above, and performs the role of the edge position detection section. The flowchart of FIG. 7 shows processing in a case of detecting the edge positions in four directions of measurement target portion P (body portion).

When this program is started, first, in step 201, a brightness level of a rectangular region of a straight line passing through two vertical sides of the wire frame W in the component image is projected along the X axis, then, in step 202, the change rate (=projection brightness/$\Delta X$) of the projection brightness on the X axis is calculated. Then, proceeding to step 203, X coordinates at two peak positions on the X axis for which the change rate of the projection brightness exceeds the specified range are detected as X coordinates of the edge positions on the left and right sides of measurement target portion P.

Next, proceeding to step 204, a brightness level of a rectangular region of a straight line passing through two left-right sides of the wire frame W in the component image is projected along the Y axis, then, in step 205, the change rate (=projection brightness/ΔY) of the projection brightness on the Y axis is calculated. Then, proceeding to step 206, Y coordinates at two peak positions on the Y axis for which the change rate of the projection brightness exceeds the specified range are detected as Y coordinates of the edge positions on the top and bottom sides of measurement target portion P. Note that, the order in which the processing of steps 201 to 203 and the processing of steps 204 to 206 are performed may be reversed.

Component shape data for image processing created by the system for creating component shape data for image processing of the present embodiment is sent to a production management computer of the component mounting line. The production management computer sends the component shape data for image processing to be used by the component mounters for performing image recognition of components to be mounted to each of the component mounters. Thus, each component mounter uses the received component shape data for image processing to perform image recognition of components held by a suction nozzle.

According to an embodiment described above, an edge position of the measurement target portion P of the component image displayed on display device 14 is detected by image processing, and when the position of the side of the wire frame W moved by the drag operation of the operator enters a specified range near to the edge position of the measurement target portion P detected by the edge position detection processing, the automatic drag processing automatically aligns the position of the side of the wire frame W to the edge position of the measurement target portion P, thus, an operator is able to accurately align the position of the sides of the wire frame W with the edge positions of the measurement target portion P even with a relatively rough drag operation. Thus, the usability of drag operation by the operator is improved, component shape data for image processing is created efficiently, the measurement accuracy of the shape data of the measurement target portion P using the wire frame W is improved, and the creation accuracy of the component shape data P for image processing is improved.

A system for creating component shape data for image processing of the present invention is not limited to the above embodiments and may be provided inside a component mounter. In this case, when investigating a cause of an error that occurred at the component mounter, the component held by a suction nozzle of the component mounter may be imaged using a component recognition camera of the component mounter, and that component image may be displayed on a display section of the component mounter such that the component shape data for image processing can be recreated. Thus, in a case in which the cause of an error that occurred at a component mounter is a mismatch of the component shape data for image processing, the component shape data for image processing can be corrected appropriately for the image processing system of the component mounter, the frequency of errors at the component mounter can be reduced, and the image recognition accuracy of components can be improved.

Further, the present invention is not limited to the above embodiments and it goes without saying that various changes and modifications can be made without departing from the gist of the invention, for example, processing for detecting edge positions of measurement target portion P (processing for detecting a position at which the change in the brightness level in the component image in the drag operation direction is large) may be changed, or the drag operation method of the side of the wire frame may be changed.

REFERENCE SIGNS LIST

11: computer (component angle correction section, wire frame drawing section, edge position detection section, automatic drag section, component shape data creation section);
12: camera;
13: input device;
14: display device (display section)

The invention claimed is:

1. A system for creating component shape data for image processing to be used when performing image recognition of a component to be mounted by a component mounter, the system comprising:
    a display section configured to display a captured component image of a component that is a creation target for the component shape data for image processing; and
    processing circuitry configured to
        draw a wire frame on top of the component image such that the wire frame surrounds a measurement target portion of the component image displayed on the display section, and to move a position of a side of the wire frame in accordance with a drag operation of an operator;
        use image processing to detect an edge position of the measurement target portion of the component image;
        automatically align the position of the side of the wire frame to the edge position of the measurement target portion when the position of the side of the wire frame moved by the drag operation of the operator enters a specified range near to the edge position of the measurement target portion;
        create the component shape data for image processing by measuring the shape data of the measurement target portion surrounded by the wire frame for which four sides of the wire frame were automatically aligned with the edge positions in four directions of the measurement target portion;
        project a brightness level of a region along a straight line that passes through each side of the wire frame in the component image along a coordinate axis extending in the drag operation direction; and
        detect a position for which a change ratio of a projection brightness exceeds a specified range as the edge position of the measurement target portion.

2. The system for creating component shape data for image processing according to claim 1, wherein
    the processing circuitry is configured to detect the edge position of the measurement target portion based on a brightness change of the component image in a direction of the drag operation.

3. The system for creating component shape data for image processing according to claim 1,
    wherein the processing circuitry is configured to correct an angle of the component image displayed on the display section, and
    wherein the processing circuitry is configured to draw the wire frame on the component image for which the angle has been corrected.

4. The system for creating component shape data for image processing according to claim 1, wherein the system for creating component shape data for image processing is provided externally to the component mounter, and an image processing system of the component mounter performs image recognition of the component to be mounted by the component mounter using the component shape data for image processing.

5. The system for creating component shape data for image processing according to claim 1, wherein the system for creating component shape data for image processing is provided in the component mounter, and when investigating a cause of an error that occurred at the component mounter, the component held by a suction nozzle of the component mounter is imaged using a component recognition camera of the component mounter, and that component image is displayed on a display section of the component mounter such that the component shape data for image processing can be recreated.

6. A method for creating component shape data for image processing to be used when performing image recognition of a component to be mounted by a component mounter, the method comprising:

displaying a captured component image of a component that is a creation target for the component shape data for image processing;

drawing a wire frame on top of the component image such that the wire frame surrounds a measurement target portion of the component image displayed on a display section, and moving a position of a side of the wide frame in accordance with a drag operation of an operator;

using image processing to detect an edge position of the measurement target portion of the component image;

automatically aligning the position of the side of the wire frame to the edge position of the measurement target portion when the position of the side of the wire frame moved by the drag operation of the operator enters a specified range near to the edge position of the measurement target portion detected by the edge position detection;

creating the component shape data for image processing by measuring the shape data of the measurement target portion surrounded by the wire frame for which four sides of the wire frame were automatically aligned with the edge positions in four directions of the measurement target portion by the automatic aligning;

projecting a brightness level of a region along a straight line that passes through each side of the wire frame in the component image along a coordinate axis extending in the drag operation direction; and detecting a position for which a change ratio of a projection brightness exceeds a specified range as the edge position of the measurement target portion.

* * * * *